United States Patent
Wong et al.

(10) Patent No.: US 7,642,946 B2
(45) Date of Patent: Jan. 5, 2010

(54) SUCCESSIVE APPROXIMATION ANALOG TO DIGITAL CONVERTER

(75) Inventors: Ark-Chew Wong, Irvine, CA (US); Marcel L. Lugthart, Aliso Viejo, CA (US); Andrew R. Chen, Redondo Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/098,842

(22) Filed: Apr. 7, 2008

(65) Prior Publication Data
US 2009/0251344 A1 Oct. 8, 2009

(51) Int. Cl.
*H03M 1/34* (2006.01)
(52) U.S. Cl. .................. 341/163; 341/154; 341/144; 341/155
(58) Field of Classification Search .................. 341/154, 341/144, 155, 163
See application file for complete search history.

(56) References Cited

U.S. PATENT DOCUMENTS

| | | | |
|---|---|---|---|
| 6,486,817 B1 * | 11/2002 | Okada et al. | 341/154 |
| 6,642,877 B2 * | 11/2003 | Leung | 341/144 |
| 7,170,436 B2 * | 1/2007 | Ye | 341/155 |
| 2002/0186158 A1 * | 12/2002 | Leung | 341/154 |

* cited by examiner

*Primary Examiner*—Jean B Jeanglaude
(74) *Attorney, Agent, or Firm*—Sterne, Kessler, Goldstein & Fox P.L.L.C.

(57) ABSTRACT

A system and method are provided allowing for successive approximation analog to digital conversion. A first differential voltage is sampled and held during a first cycle. The first differential voltage is converted to a differential current. A second differential voltage is generated based on the differential current flowing through parallel-coupled respective first and second variable resistances. First and second portions of the second differential voltage are compared to produce a comparison result therefrom. Successive approximation is used to generate a signal based on the comparison result, the signal being an output signal and being used to control resistances of respective ones of the first and second variable resistances during subsequent cycles.

18 Claims, 12 Drawing Sheets

| CYCLE | CONTROL REGISTERS (to DAC) | | | | | | | | OUTPUT REGISTERS | | | | | | | | |
|---|---|---|---|---|---|---|---|---|---|---|---|---|---|---|---|---|---|
| | <7> | <6> | <5> | <4> | <3> | <2> | <1> | <0> | <7> | <6> | <5> | <4> | <3> | <2> | <1> | <0> | oclk |
| RESET | 1 | 0 | 0 | 0 | 0 | 0 | 0 | 0 | x | x | x | x | x | x | x | x | 0 |
| 1 | 1 | 0 | 0 | 0 | 0 | 0 | 0 | 0 | x | x | x | x | x | x | x | x | 0 |
| 2 | a7 | 1 | 0 | 0 | 0 | 0 | 0 | 0 | x | x | x | x | x | x | x | x | 0 |
| 3 | a7 | a6 | 0 | 0 | 0 | 0 | 0 | 0 | x | x | x | x | x | x | x | x | 0 |
| 4 | a7 | a6 | 0 | 1 | 0 | 0 | 0 | 0 | x | x | x | x | x | x | x | x | 0 |
| 5 | a7 | a6 | a5 | a4 | 1 | 0 | 0 | 0 | x | x | x | x | x | x | x | x | 0 |
| 6 | a7 | a6 | a5 | a4 | a3 | 1 | 0 | 0 | x | x | x | x | x | x | x | x | 0 |
| 7 | a7 | a6 | a5 | a4 | a3 | a2 | 1 | 0 | x | x | x | x | x | x | x | x | 0 |
| 8 | a7 | a6 | a5 | a4 | a3 | a2 | a1 | 1 | x | x | x | x | x | x | x | x | 0 |
| 9 | 1 | 0 | 0 | 0 | 0 | 0 | 0 | 0 | a7 | a6 | a5 | a4 | a3 | a2 | a1 | a0 | 1 |
| 10 | b7 | 1 | 0 | 0 | 0 | 0 | 0 | 0 | a7 | a6 | a5 | a4 | a3 | a2 | a1 | a0 | 1 |
| 11 | b7 | b6 | 0 | 1 | 0 | 0 | 0 | 0 | a7 | a6 | a5 | a4 | a3 | a2 | a1 | a0 | 1 |
| 12 | b7 | b6 | b5 | b4 | 0 | 0 | 0 | 0 | a7 | a6 | a5 | a4 | a3 | a2 | a1 | a0 | 1 |
| 13 | b7 | b6 | b5 | b4 | 1 | 0 | 0 | 0 | a7 | a6 | a5 | a4 | a3 | a2 | a1 | a0 | 0 |
| 14 | b7 | b6 | b5 | b4 | b3 | 1 | 0 | 0 | a7 | a6 | a5 | a4 | a3 | a2 | a1 | a0 | 0 |
| 15 | b7 | b6 | b5 | b4 | b3 | b2 | 1 | 0 | a7 | a6 | a5 | a4 | a3 | a2 | a1 | a0 | 0 |
| 16 | b7 | b6 | b5 | b4 | b3 | b2 | b1 | 1 | a7 | a6 | a5 | a4 | a3 | a2 | a1 | a0 | 0 |
| 17 | 1 | 0 | 0 | 0 | 0 | 0 | 0 | 0 | b7 | b6 | b5 | b4 | b3 | b2 | b1 | b0 | 1 |
| 18 | c7 | 1 | 0 | 0 | 0 | 0 | 0 | 0 | b7 | b6 | b5 | b4 | b3 | b2 | b1 | b0 | 1 |
| ... | etc... | | | | | | | | ...... | | | | | | | | |

SUCCESSIVE APPROXIMATION ANALOG TO DIGITAL CONVERTER

BACKGROUND

1. Field of the Invention

The present invention generally relates to SAR ADCs.

2. Related Art

In current successive approximation register analog-to-digital converter (SAR ADC) implementations, most of digital-to-analog converters (DACs) are implemented capacitively. The problem with capacitive DACs is that they are large in size, and due to their nature of implementation they tend to limit bandwidth, which can translate into high current consumption for high speed. Current mode DACS can also be used, but are limited by noise of the active current sources, and have relatively high current consumption.

Also, due to the nature of the successive approximation search algorithm, traditional SAR ADCs typically use N+1 or N+2 cycles to complete a single conversion from an analog signal to a digital signal. Where N corresponds to the ADC resolution, e.g., 8 bits, the SAR ADC typically would require 8+1=9 cycles to complete 1 cycle of conversion.

Therefore, what is needed is a SAR ADC that alleviates the problems with using capacitive and current mode DACs, and possibly reduces a required number of cycles for conversion.

SUMMARY

In one embodiment of the present invention, there is provided a system comprising a sample and hold device, a voltage-to-current converter, a resistive digital-to-analog converter (R-DAC), a comparator, and a successive approximation device (SAR). The sample and hold device is configured to receive an input voltage signal during a first cycle. The voltage-to-current converter is configured to convert the input voltage signal into a current. The R-DAC is configured to receive the current and to generate a differential voltage signal therefrom. The comparator is configured to receive the differential voltage signal from the R-DAC and to produce a comparison result therefrom. The SAR is configured to generate a signal based on the comparison result, the signal being output from the system and fed-back to the R-DAC to control a resistance of the R-DAC during subsequent cycles.

Another embodiment of the present invention provides a method including the following steps. A first differential voltage is sampled and held during a first cycle. The first differential voltage is converted to a differential current. A second differential voltage is generated based on the differential current flowing through parallel-coupled respective first and second variable resistances. First and second portions of the second differential voltage are compared to produce a comparison result therefrom. Successive approximation is used to generate a signal based on the comparison result, the signal being an output signal and being used to control resistance values for respective ones of the first and second variable resistances during subsequent cycles.

A further embodiment of the present invention provides a circuit comprising a sample and hold portion, a SAR, a R-DAC coupled to the SAR, a converter coupled between the sample and hold portion and the R-DAC, and a comparator coupled between the R-DAC and the SAR.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

Figure 1:
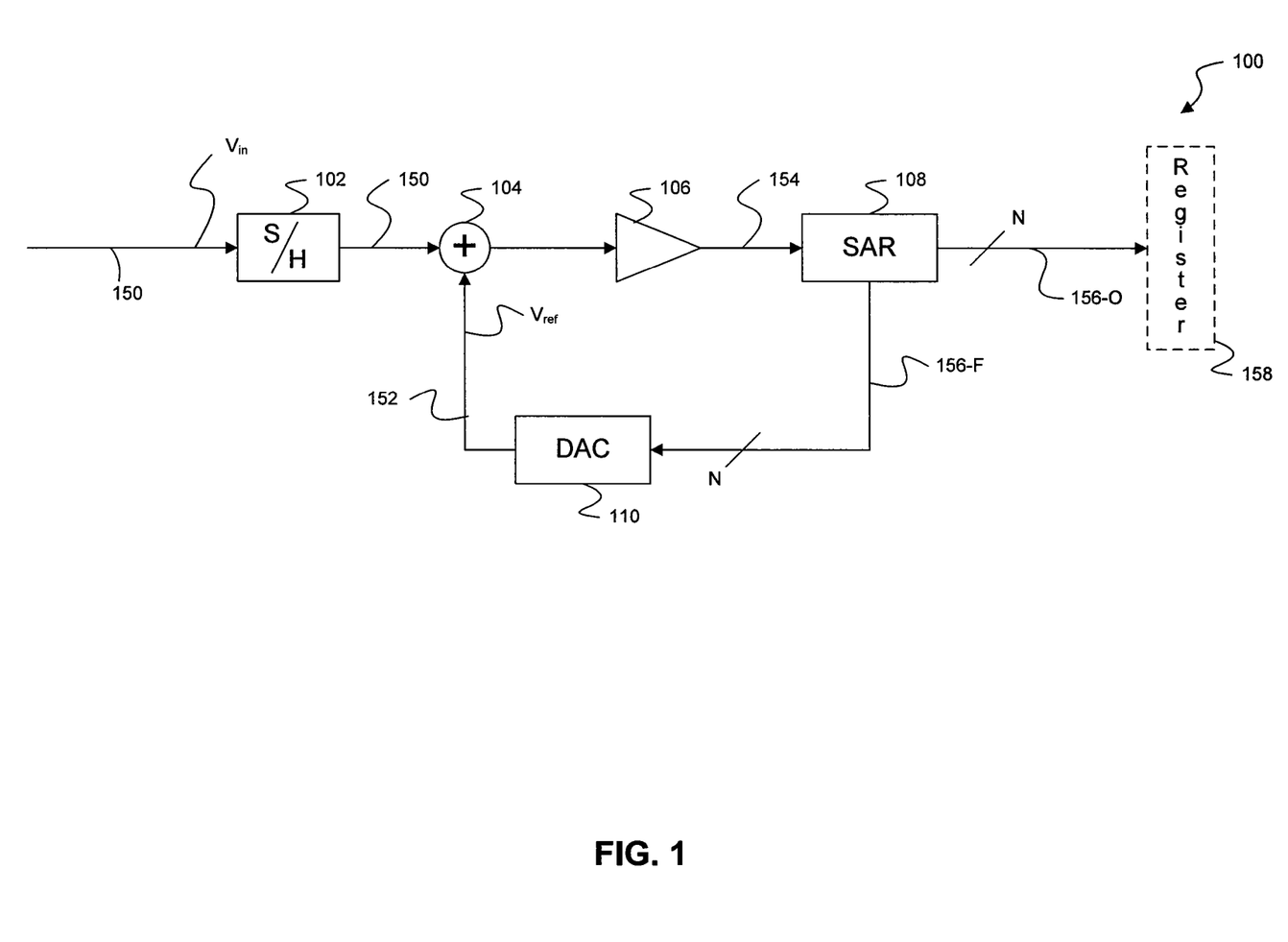
FIG. 1 shows a successive approximation analog-to-digital converter (SAR ADC).

FIG. 1 shows a successive approximation analog-to-digital converter (SAR ADC) 100. SAR ADC 100 includes a sample and hold device (S/H) 102, a summing device 104, a comparator 106, a successive approximation device or register (SAR) 108, and a digital-to-analog converter (DAC) 110. Each of these devices may be implemented in firmware, hardware, or software, for example, these devices can be implemented as circuits.

Sample and hold device 102 acquires an input signal 150, e.g., an analog signal, such as an input voltage ($V_{in}$) (hereinafter $V_{in}$ and 150 are used interchangeably). Comparator 106 compares $V_{in}$ to a signal 152, e.g., $V_{ref}$, of DAC 110, and outputs a result signal 154 of the comparison to SAR 108. SAR 108 is designed to supply an approximate digital code 156-F with N bits of $V_{in}$ to DAC 110, and the same approximate digital code as an output signal 156-O, for example to be stored in one or more optional registers 158. During subsequent cycles, DAC 110 supplies comparator 106 with an analog voltage equivalent 152 of the subsequent digital codes 156-F output from SAR 108 for comparison with $V_{in}$.

In one example, SAR 108 is initialized so that a most significant bit (MSB) of signal 156-F is equal to a digital 1. This digital code 156-F is fed into DAC 110, which then supplies the analog equivalent signal 152 of this digital code 156-F into comparator 106 for comparison with the sampled input voltage $V_{in}$. If a value of analog equivalent signal 152 exceeds a value of $V_{in}$, comparator 106 causes SAR 108 to reset this bit and set the next bit to a digital 0. If a value of analog equivalent signal 152 is lower than $V_{in}$, then the bit is left a 1 and the next bit is set to 1. This process, which may be referred to as a "binary search," continues until every bit in SAR 108 has been tested. The resulting code established through N+1 cycles of signal 156-0 being output is the digital approximation of the sampled input voltage $V_{in}$. In one example, the resulting code is output by the SAR ADC 100 at a determined end of the conversion (EOC), e.g., after a certain number of cycles, to optional register 158.

In one example, mathematically:

$$V_{in} = xV_{ref}$$

So x in [−1, 1] is the normalized input voltage. The objective is to approximately digitize x to an accuracy of $\frac{1}{2}^n$. The algorithm proceeds as follows. Initial approximation $$x_0 = 0$$

ith approximation:

$$x_i = x_{i-1} - s(x_{i-1} - x)/2^i$$

where, s(x) is the signum-function(sgn(x)) (+1 for x≧0, −1 for x<0).

It follows using mathematical induction that $$|x_n - x| \leq \frac{1}{2}^n$$

Thus, SAR ADC 100 receives an input voltage 150. A reference voltage 152 is used to normalize the input 150. DAC 110 is used to convert the ith approximation $x_i$ to a voltage 152. Comparator 106 is used to perform the function $s(x_i - x)$ by comparing voltage 152 with input voltage 150. SAR 108 is used to store output 154 of comparator 106 and applies:

$$x_{i-1} - s(x_{i-1} - x)/2^i$$

Figure 2:
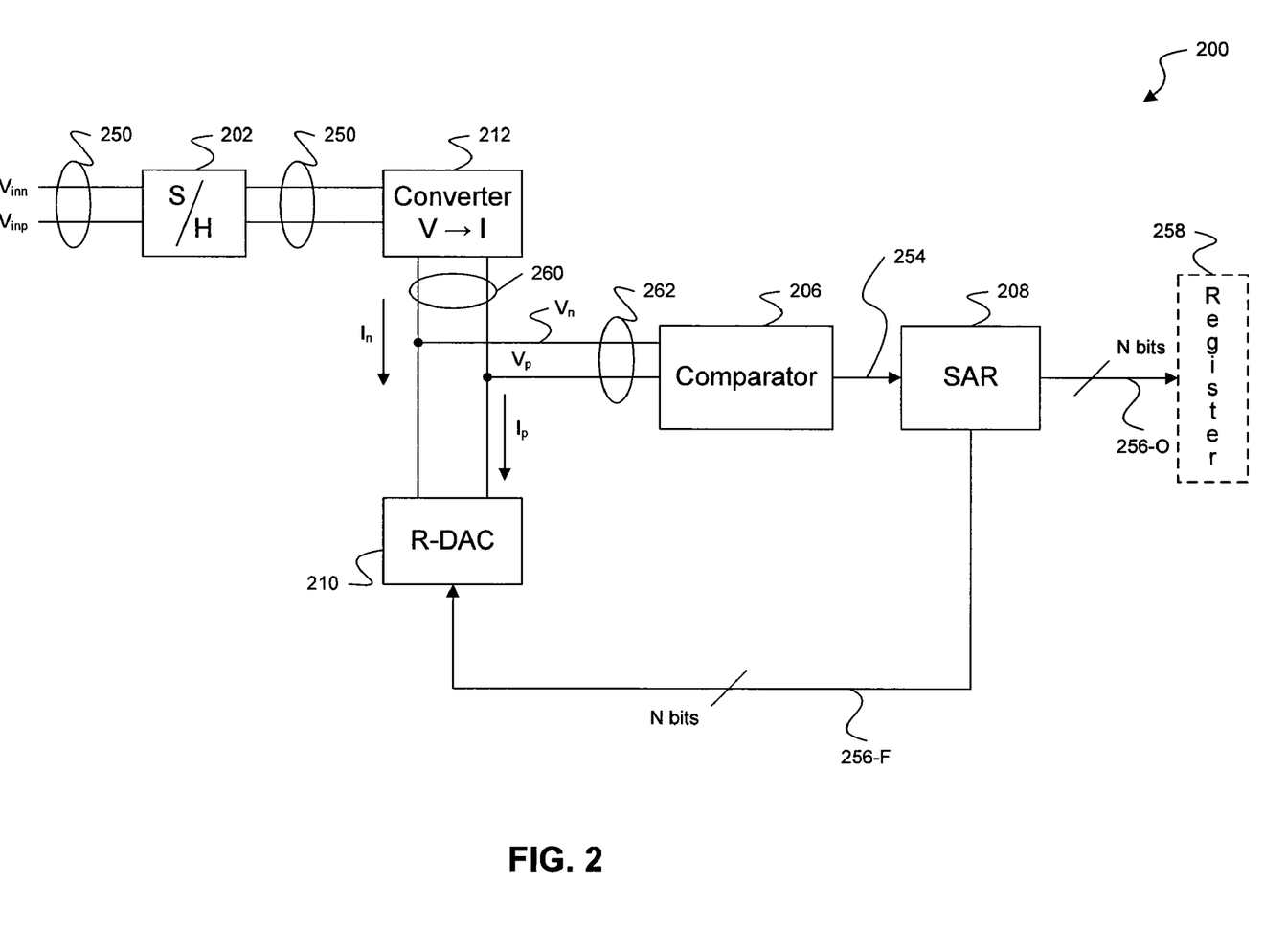
FIG. 2 shows another embodiment of a SAR ADC.

FIG. 2 shows a SAR ADC 200, according to one embodiment of the present invention. In one example, SAR ADC 200 comprises a sample and hold device 202, a converter 212 (e.g., a voltage to current (V-I) converter), a comparator 206, a successive approximation register (SAR) 208, and a resistive digital-to-analog converter (R-DAC) 210. Again, each of these devices may be implemented in firmware, hardware, or software, for example as circuits.

In one example, converter 212 can comprise a degenerative differential pair.

In one example, sample and hold 202 can comprise an interleaving sample and hold circuit.

Figure 3A:
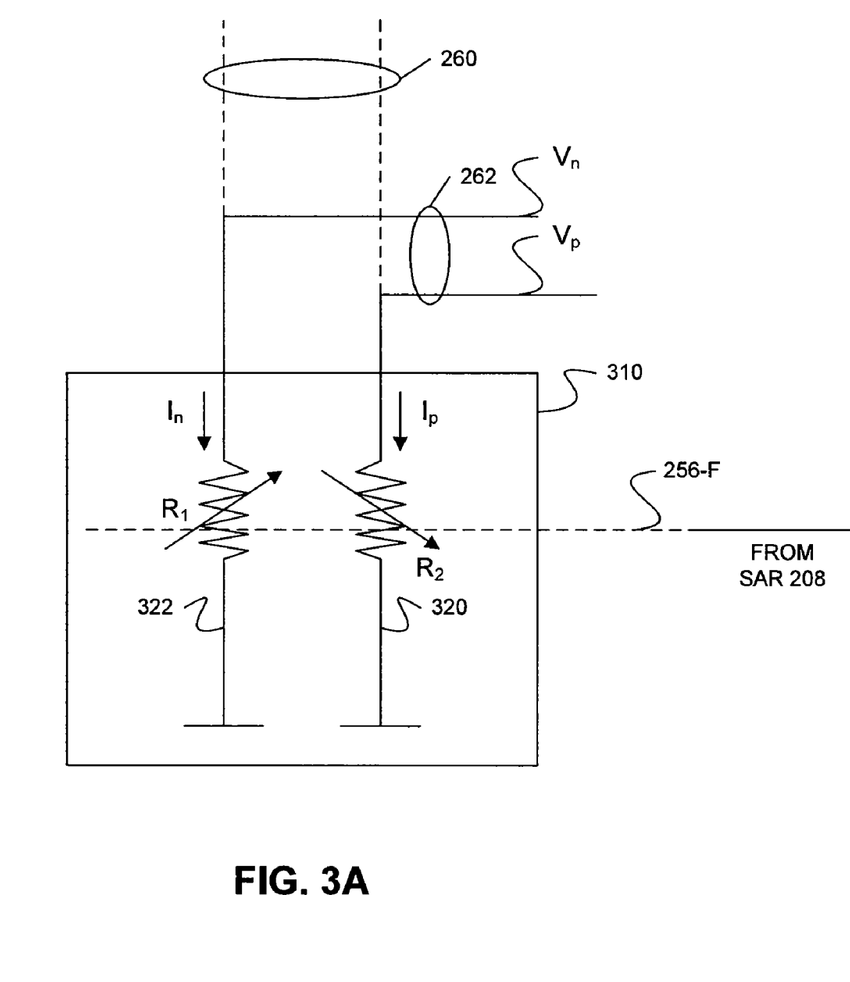
FIGS. 3A and 3B show various schemes for a resistive digital-to-analog converter (R-DAC), according to various embodiments of the present invention.

FIG. 3A shows a resistive digital-to-analog converter (R-DAC) 310, according to one embodiment of the present invention. In one example, R-DAC 310 may replace R-DAC 210 in FIG. 2, and R-DAC 310 may include first and second banks 320 and 322 with a respective variable resistance R1 and R2 in each.

With reference to FIGS. 2 and 3A, in an exemplary operation, during a first cycle an input signal 250, e.g., an analog signal, such as $V_{in}$, may be a differential signal $V_{inn}$ and $V_{inp}$, which is captured by sample and hold device 202. The voltage based differential signal 250 is converted using converter 212 into a differential current signal 260 including portions $I_n$ and $I_p$. Respective portions $I_n$ and $I_p$ of differential current 260 flow through respective banks 320 and 322 having respective variable resistances R1 and R2 to produce a respective differential voltage 262 having respective portions $V_n$ and $V_p$. During the first cycle, resistances R1 and R2 are substantially equal. Comparator 206 compares voltage $V_p$ to $V_n$ to determine a difference signal 254 based on a difference in value therebetween. Difference signal 254 is output to SAR 208. SAR 208 then outputs a value 256 (e.g., 256-O (e.g., 1 in FIGS. 4 and 5) and 256-F), which may be a logic 1, based on this first difference signal 254.

During a second cycle, signal 256-F (e.g., a logic 1) is used to adjust resistances R1 and R2 to produce subsequent values for $V_p$ and $V_n$, such that voltages $V_p$ and $V_n$ begin to converge towards the substantially a same voltage value. Thus, in this example, convergence of $V_p$ and $V_n$ occurs between a $2^{nd}$ through $8^{th}$ cycle to produce $2^{nd}$ through $8^{th}$ values for output 256-O (e.g., values a7 to a1 in FIGS. 4 and 5). After the $8^{th}$ cycle, when $V_p$ substantially equals $V_n$, a value of difference signal 254 generated by comparator 206 should be approximately 0.

Figure 3B:
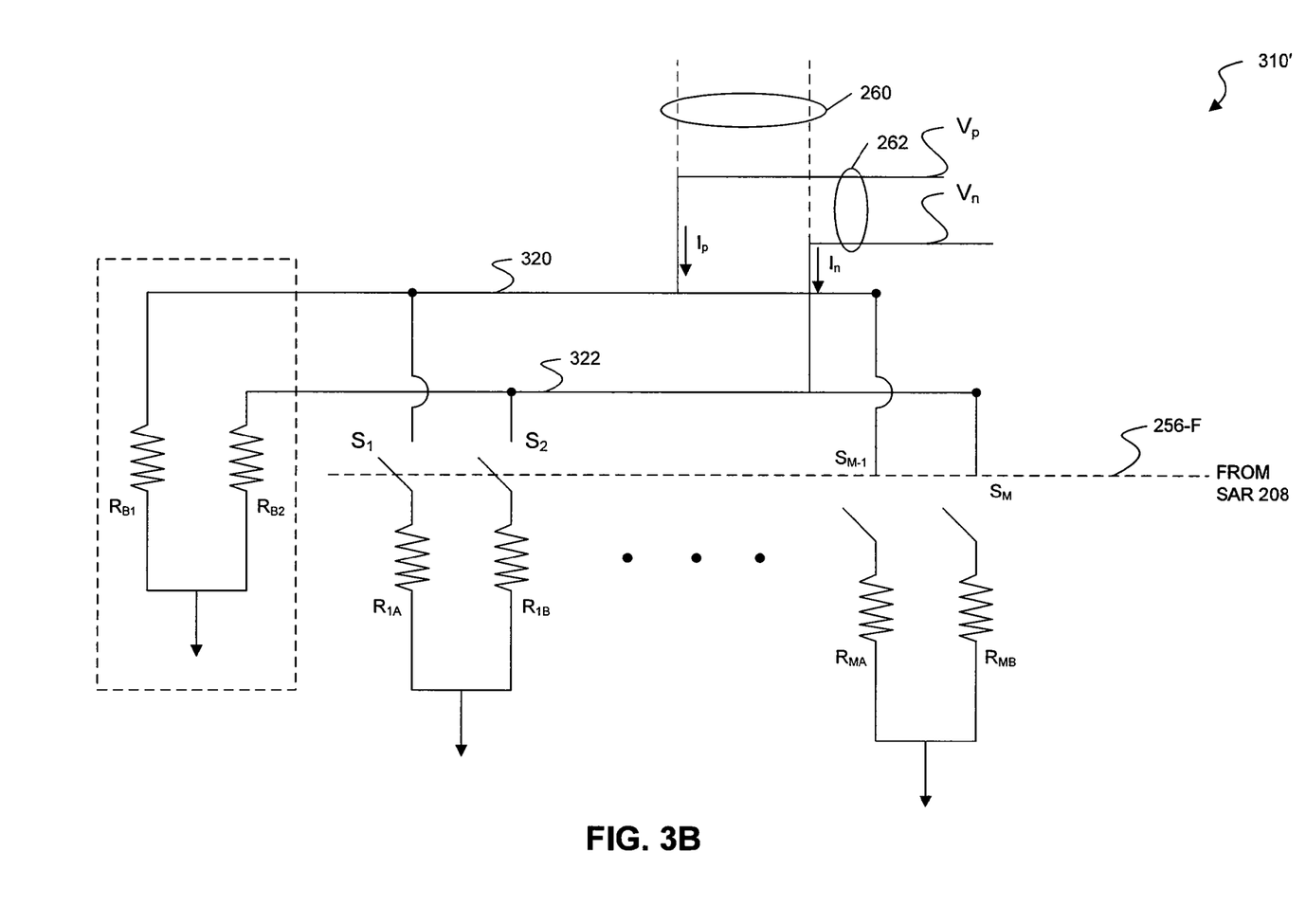

FIG. 3B shows a resistive digital-to-analog converter (R-DAC) 310', according to one embodiment of the present invention. In this example, R-DAC 310' may replace R-DAC 210 in FIG. 2, and R-DAC 310' includes parallel coupled resistor pairs R1A/R1B to RMA/RMB (M being a positive integer). First and second banks 320, 322 of the parallel coupled resistor pairs are formed using these resistors through controlling of switches S1, S2, . . . , SM−1, SM. In the example shown, first bank 320 is coupled to odd numbered switches S1, . . . , SM−1, while second bank 322 is coupled to even numbered switches S2, . . . , SM. For example, first and second banks 320 and 322 may be used to form respective overall variable resistances R1 and R2 (see FIG. 3A) based on a positioning (either open or closed) of switches S1, . . . , SM. In this example, each subsequent position of switches S1, . . . , SM is controlled by subsequent values of signal 256-F (see FIG. 2) output from SAR 206 based on a previous difference signal 254 (see FIG. 2).

Additionally, or alternatively, R-DAC 310' can comprise a bias resister pair RB 1 and RB2. For example, bias resister pair RB1 and RB2 may be used to help offset a large current passing through converter 212. In some instances, in order to exhibit linearity, converter 212 may require a larger bias current than signal current, e.g., by a factor of 3:1. However, it may be undesirable to have the additional current flow through R-DAC 310'. Thus, in order to reduce the current flowing through R-DAC 310', bias resister pair RB1 and RB2 may be used to absorb the undesirable current.

As is well known, in one example, to determine overall resistances R1 and R2 as shown in FIG. 3A, the following equation can be used for the exemplary scheme shown in FIG. 3B:

$$R1 \text{ or } R2 = Req = \frac{R1A * \ldots * RMA}{R1A + \ldots + RMA}$$

Additionally, or alternatively, various other arrangements of resistors can be used for an R-DAC, as would be apparent to a skilled artisan upon reading and understanding this description.

In one example, through use of the arrangement shown in FIGS. 2 and 3A-3B, an 8 bit output 256-O can be produced in 8 cycles, instead of a conventional 8+1 cycles. For example, conventional SAR ADCs may require 8+1 cycles to produce a digital signal, while using SAR ADC 200 allows for the digital signal to be produced in 8 cycles. Reducing the required cycle time by one cycle can allow for an increase in speed for SAR ADC 200. For example, if a conventional system runs internally at 900 MHz, SAR ADC 200 can run at 800M Hz, so about an 11% speed advantage may be obtained. This may be possible because, as compared to conventional SAR ADCs, using SAR ADC 200 a last decision does not have be fed to R-DAC 310, rather once the last decision is made by SAR 208, the decision is transmitted as signal 256-O to optional register 258.

Figure 4:
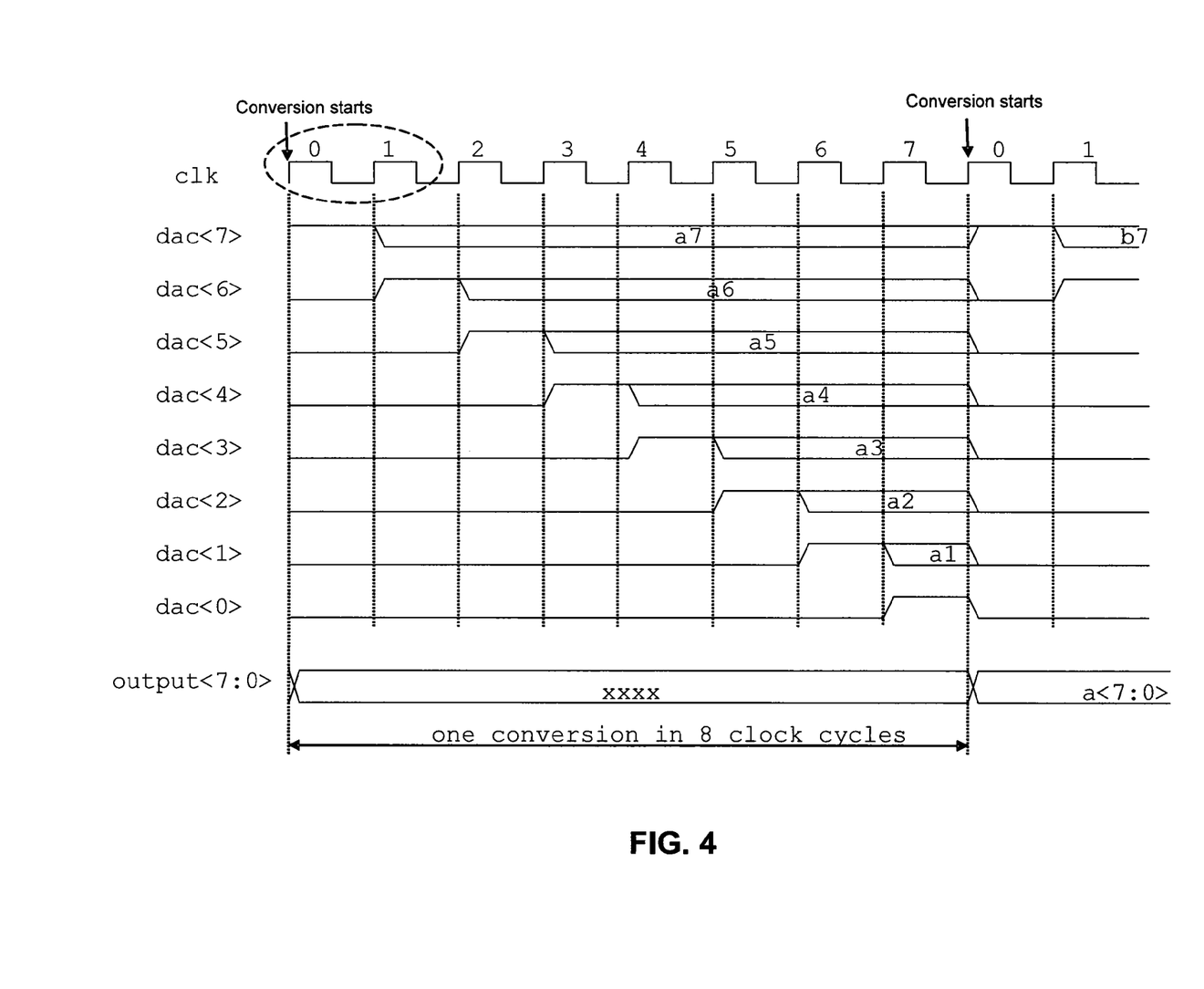
FIG. 4 shows a timing diagram of a SAR ADC, according to one embodiment of the present invention.

FIG. 4 shows a timing diagram of a SAR ADC, according to one embodiment of the present invention. For example, the timing diagram can be for SAR ADC 200 discussed above. FIG. 4 shows the use of 8 cycles in order to produce an 8 bit output. In this example, the process may include the use of SAR 208 going through a binary search. In the example shown in FIGS. 2 and 4, a first cycle starts at middle code 1000 received by R-DAC 210 from SAR 208. Then, depending on a MSB of signal 254 from comparator 206, the SAR 208 decides whether the next MSB is a logic 1 or 0. This cycle is repeated for seven more cycles. Therefore, at end of 8 cycles signal 256-O has produced an 8 bit output, as shown.

Figure 5:
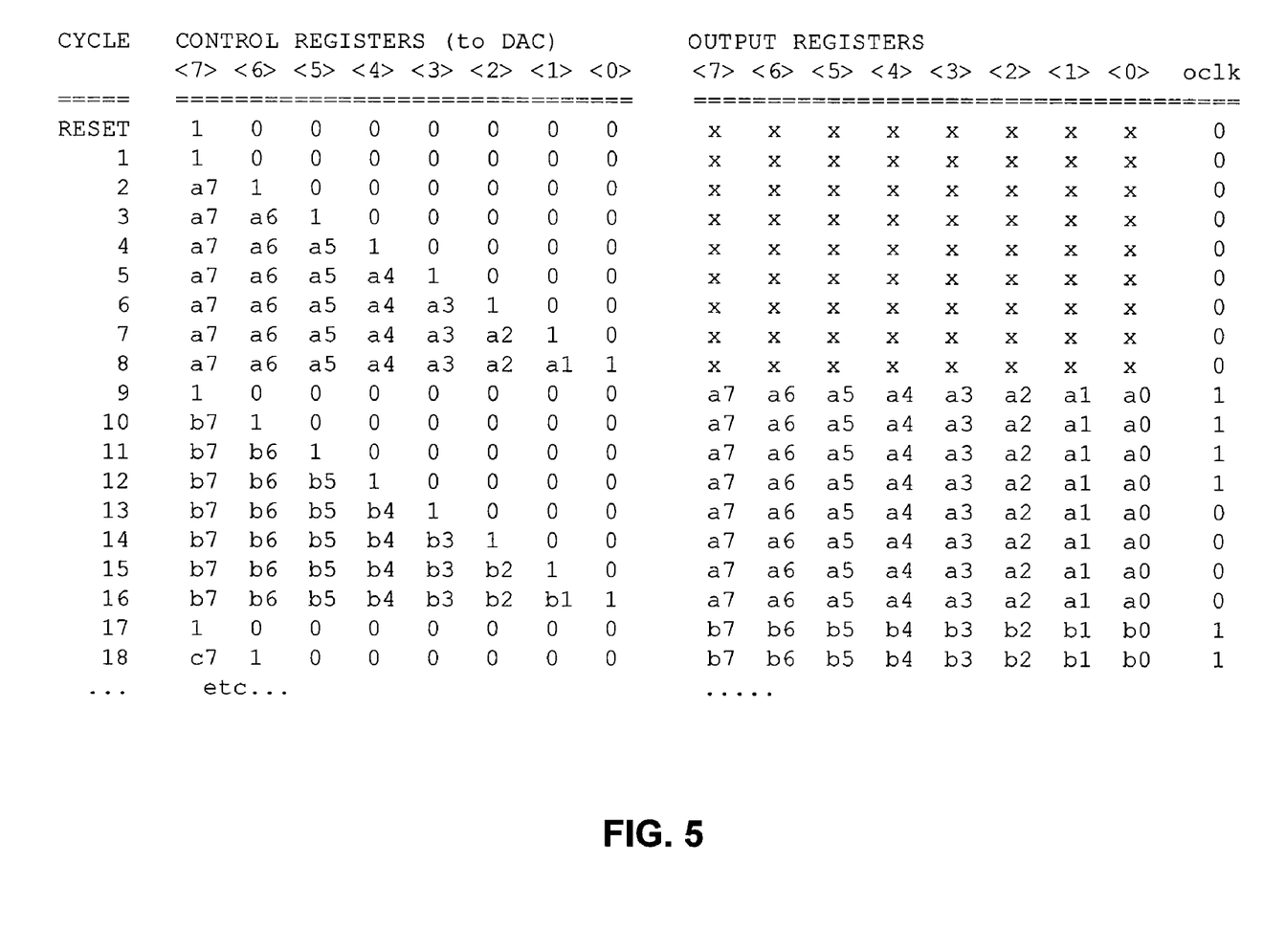
FIG. 5 shows values output from a SAR ADC, according to one embodiment of the present invention.

FIG. 5 shows values output from a SAR ADC 200 to a control register (e.g., R-DAC 210 in FIG. 2) and an output register (e.g., register 258 in FIG. 2) during a series of eight cycles, according to one embodiment of the present invention.

FIGS. 6, 7, 8, and 9 show various embodiments of SAR ADCs 600, 700, 800, and 900.

Figure 6:
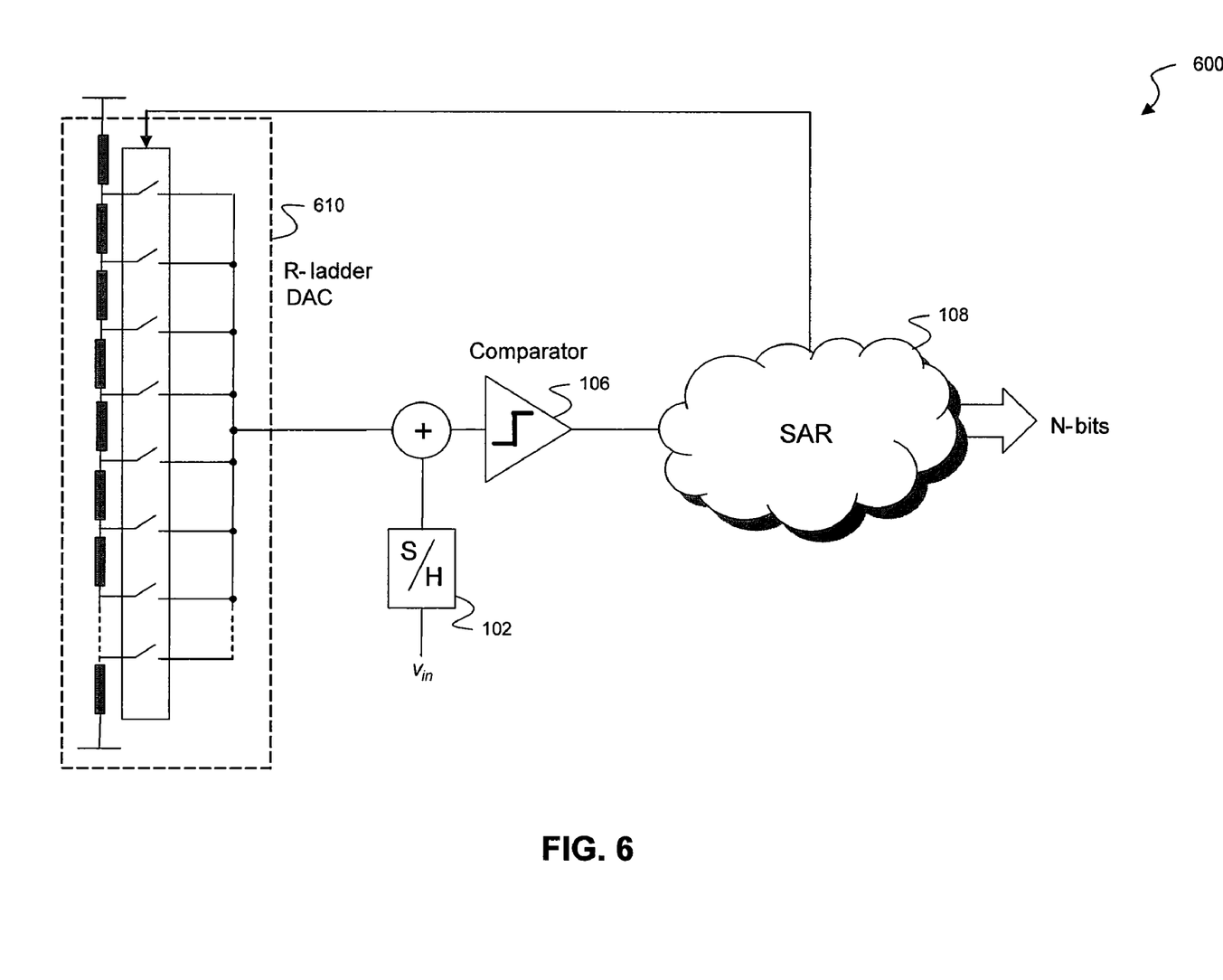
FIGS. 6, 7, 8, and 9 show various additional embodiments of a SAR ADC.

In FIG. 6, in SAR ADC 600, as compared to SAR ADC 100, DAC 110 is replaced with a resistive ladder digital-to-analog converter (R-ladder DAC) 610. SAR ADC 600 may be bandwidth limited based on the switches in the R-ladder DAC 610.

Figure 7:
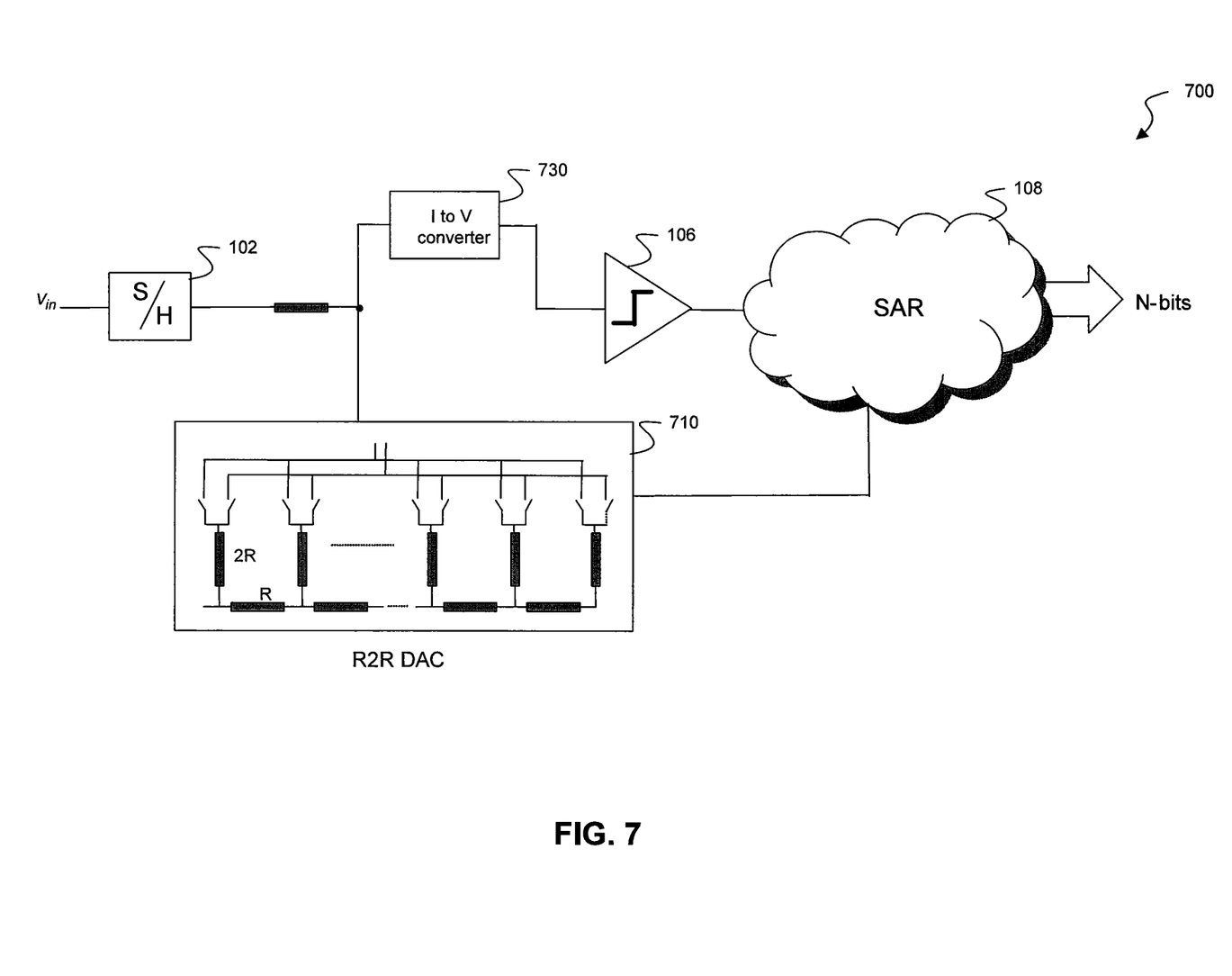

In FIG. 7, as compared to SAR ADC 100, SAR ADC 700 comprises a current-to-voltage converter 730 positioned between sample and hold device 102 and comparator 106. Also, DAC 100 is replaced with a resistive DAC (R-DAC) 710, which includes both parallel and series connected resistors. In the example shown, the parallel coupled resistors have a value 2R and the series coupled resistors have a value R. Thus, the configuration of a R-DAC 710 may be referred to as a R2R DAC. In one example, current-to-voltage converter 730 can comprise a transimpedance amplifier (TIA). This arrangement for SAR ADC 700 may allow for less switches in R-DAC 710 compared to R-DAC 610. However, SAR ADC 700 may require larger power consumption as compared to other embodiments discussed herein based on using a TIA for current-to-voltage converter 730.

Figure 8:
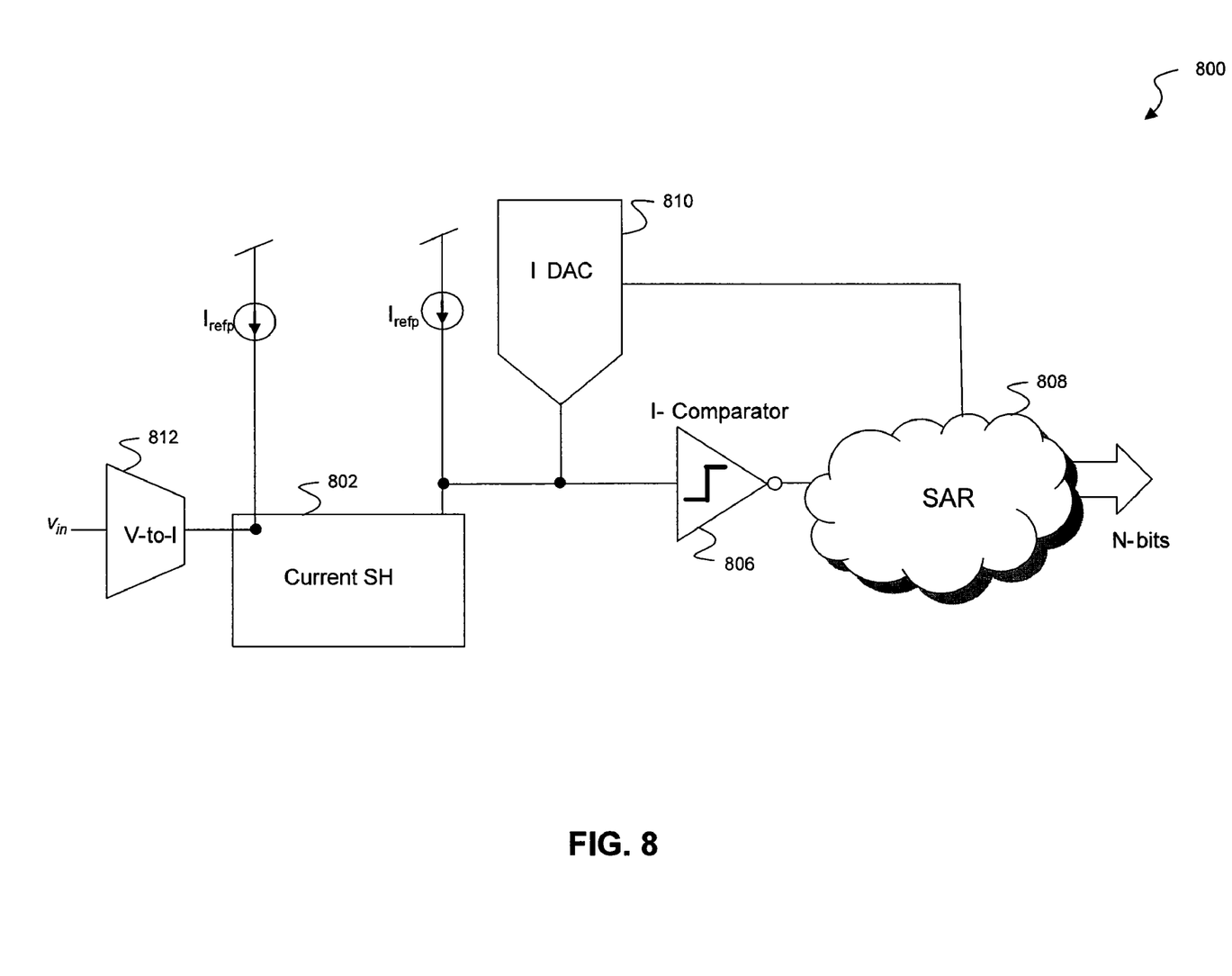

In FIG. 8, as compared to SAR ADC 100, for SAR ADC 800 input voltage Vin is converted to an input current using a voltage-to-current converter (V-to-I) 812. The current flows to a current-based sample and hold device 802 biased using current sources Irefp, as shown. Also, SAR ADC 800 comprises a current based DAC (I-DAC) 810 coupled to a current based comparator (I-comparator) 806, the latter of which feeds a comparison result signal to SAR 808. As compared to other embodiments discussed above, the configuration of SAR ADC 800 may provide higher speed based on being a current-mode system. However, there may be undesirable noise produced through use of I-DAC 810, higher current consumption through use of current sources Irefp, and a mismatch may occur between current sources Irefp and current-based sample and hold device 802.

Figure 9:
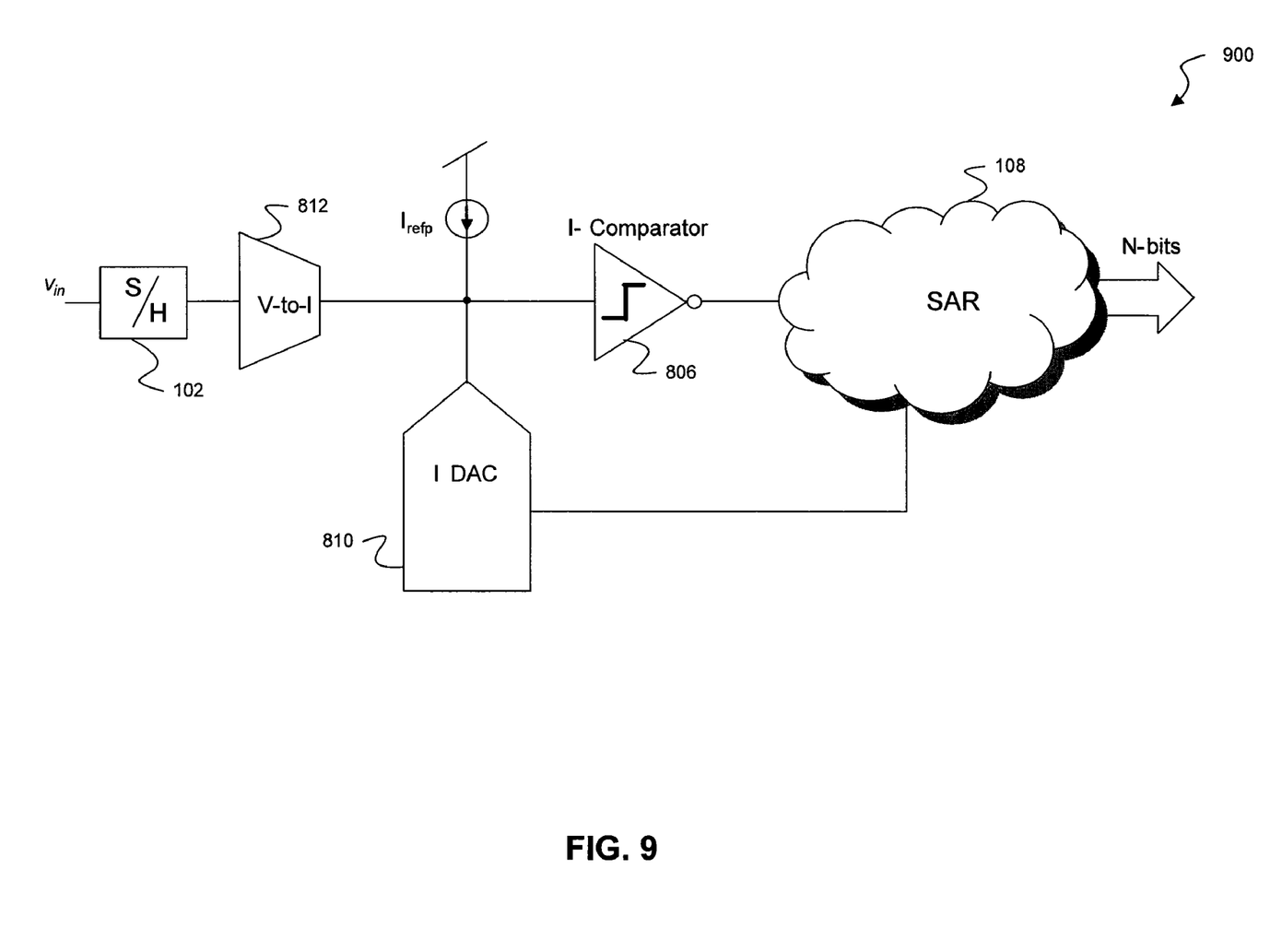

In FIG. 9, which is also current mode based like the embodiment in FIG. 8, SAR ADC 900 includes a sample and hold device 102, a voltage-to-current converter (V-to-I) 812, an I-DAC 810 (which is now only biased by a single current source Irefp as opposed to the two used in the embodiment of FIG. 8), a current based comparator 806, and a SAR 108. As compared to other embodiments above, for example SAR ADC 800, SAR ADC 900 may not have a mismatch between current sources Irefp and current-based sample and hold device 802, but may still exhibit undesirable noise through use of I-DAC 810 and/or higher current consumption through use of current source Irefp.

Figure 10:
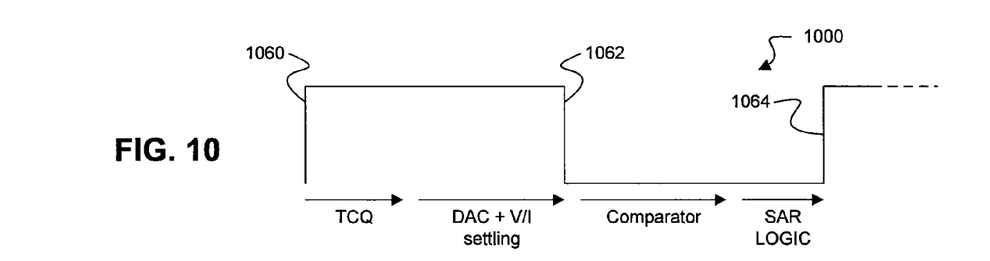
FIGS. 10, 11, and 12 show various clock diagrams, according to various embodiments of the present invention.
Figure 11:
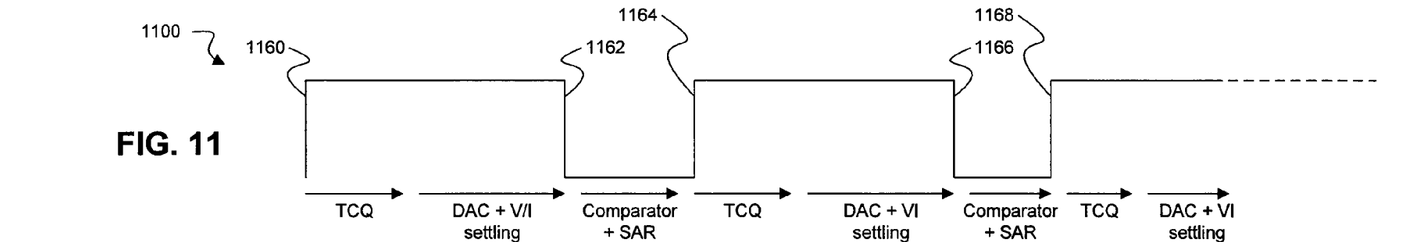
Figure 12:
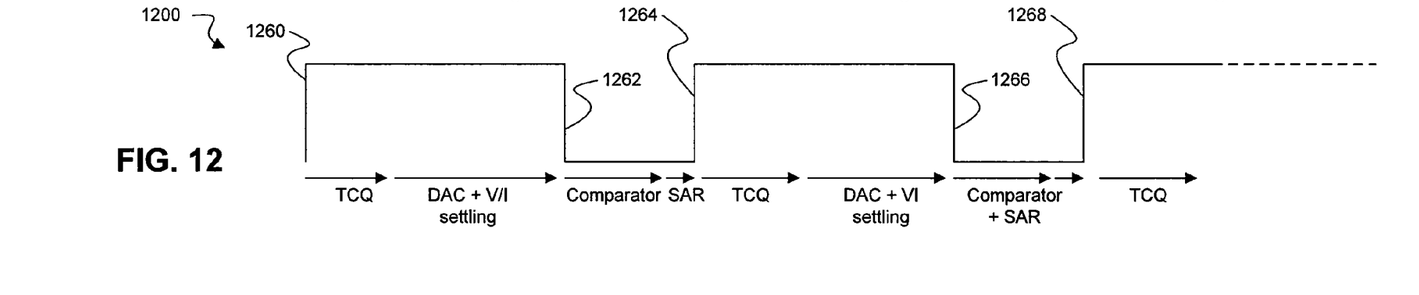

FIGS. 10, 11, and 12 show various clock signals 1000, 1100, and 1200 for a SAR ADC, according to various embodiments of the present invention. For example, SAR ADC 200 may utilize these clock signals to clock one or more of SAR 208 and comparator 206. For example, these clock signals can be about 1 GHz clock rates.

In FIG. 10, a clock signal 1000 is shown. For example, this may be a 50% duty cycle clock signal. Each clock cycle is broken into critical events, as shown. In one example, a clock cycle occurs between subsequent rising edges 1060 and 1064. Starting at a rising edge 1060 of the clock cycle, a TCQ delay occurs and a logic delay occurs due to DAC and V/I converter settling. Then, starting at falling edge 1062 of the clock cycle, a logic delay occurs due to a comparator settling and SAR logic. For example, analog inputs to the comparator need to settle before the SAR operates.

FIGS. 11 and 12 show exemplary modifications to clock signal 1000 than may be used to reduce bandwidth requirements for a DAC and voltage-to-current converter, e.g., R-DAC 210 and converter 212 shown in FIG. 2. Although different SAR ADCs can utilize clock signals 1100 and 1200, SAR ADC 200 will be used for illustration.

FIG. 11 shows a clock signal 1100, according to an embodiment of the present invention. Starting with a rising edge 1160 of a clock cycle, a TCQ delay occurs and a logic delay occurs due to DAC and V/I converter settling. Then, starting at falling edge 1162 of the clock cycle, a logic delay occurs due to comparator settling and SAR logic. For example, analog inputs to comparator 206 need to settle before SAR 208 operates.

This clock signal 1100 does not exhibit a 50% duty cycle, but rather a variable duty cycle based on when a decision of comparator 206 occurs. For example, this can be done to allow at least one of R-DAC 210 or converter 212 to have more settling time. For example, a decision of comparator 206 is detectable, as is known to a skilled artisan, through generation of a "done" signal, or the like, that can be produced once comparator 206 has made a decision. Once the "done" signal is detected, a small delay is allowed for SAR logic, which is much smaller than the delay shown in clock signal 1000, but then a next clock cycle immediately starts at rising edge 1164.

As can be seen, during a second clock cycle, the same delays occur during a first half of the clock cycle, and at falling edge 1166 similar delays occur at the second half of the clock cycle. However, in this instance comparator 206 makes a faster decision, and rising edge 1168 occurs in less time from falling edge 1166 than rising edge 1164 occurred from falling edge 1162. Thus, if a subsequent comparator decision is quicker than the first comparator decision, the duty cycle is further altered. In one example, through use of a variable duty cycle based on when a comparator issues a "done" signal, additional time for DAC settling before a next comparison may be allowed.

Thus, in this embodiment, there may be no fixed clock, rather self clocking is utilized based on comparator implementation. This may be referred to as self adjusting to optimal cycle. A falling edge of each clock cycle stays fixed in time, but a rising edge of each clock cycle is variable, such that as soon as the comparator makes decisions a next cycle is immediately started. This embodiment may allow for at least two scenarios. First, if a performance for a SAR ADC is desired to remain substantially the same, through using a reduced clock period, a higher sample rate can be achieved. Second, if a sampling rate is maintained, a lower performance specification for analog devices can be allowed, which may allow for reduced power consumption or error rate.

FIG. 12 shows a clock signal 1200, according to another embodiment of the present invention. In this embodiment, a permanent change in duty cycle is implemented from the 50% duty cycle of clock signal 1000. Similar delays occur between rising edge 1260 and falling edge 1262, and falling edge 1262 and subsequent rising edge 1264 as edges 1060/1160, 1062/1162, and 1064/1164 discussed above. However, for clock signal 1200 a determination is made as to when a comparator decision is normally made before setting a duty cycle of the clock signal, and this determined decision time set as a next rising edge 1264, 1268 of the clock signal to reduce duration between falling edge 1262 and subsequent rising edge 1264, etc. The same non-50% duty cycle occurs through a second clock cycle, i.e., rising and falling edges 1266 and 1268, etc. However, this non-50% duty cycle is not further changed or varied based on actual performance of the comparator, as was done in the embodiment shown in FIG. 11.

These clocks shown in FIGS. 10, 11, and 12 can be used for any SAR triggered by rising edge and comparator clock comparator triggered by falling edge. As can be appreciated, these clocks shown in FIGS. 10, 11, and 12 can be applied to other architectures.

In one example, SAR ADC 200 can be used for applications, such as satellite receivers. Additionally, or alternatively, due to its scalable nature SAR ADC 200 can be adapted for applications with 6-10 bits requirements. Also, through using the arrangement shown above, in one example, SAR ADC 200 has extremely low power and small area, e.g., about a factor of 2 lower power and area than conventional ADCs.

Figure 13:
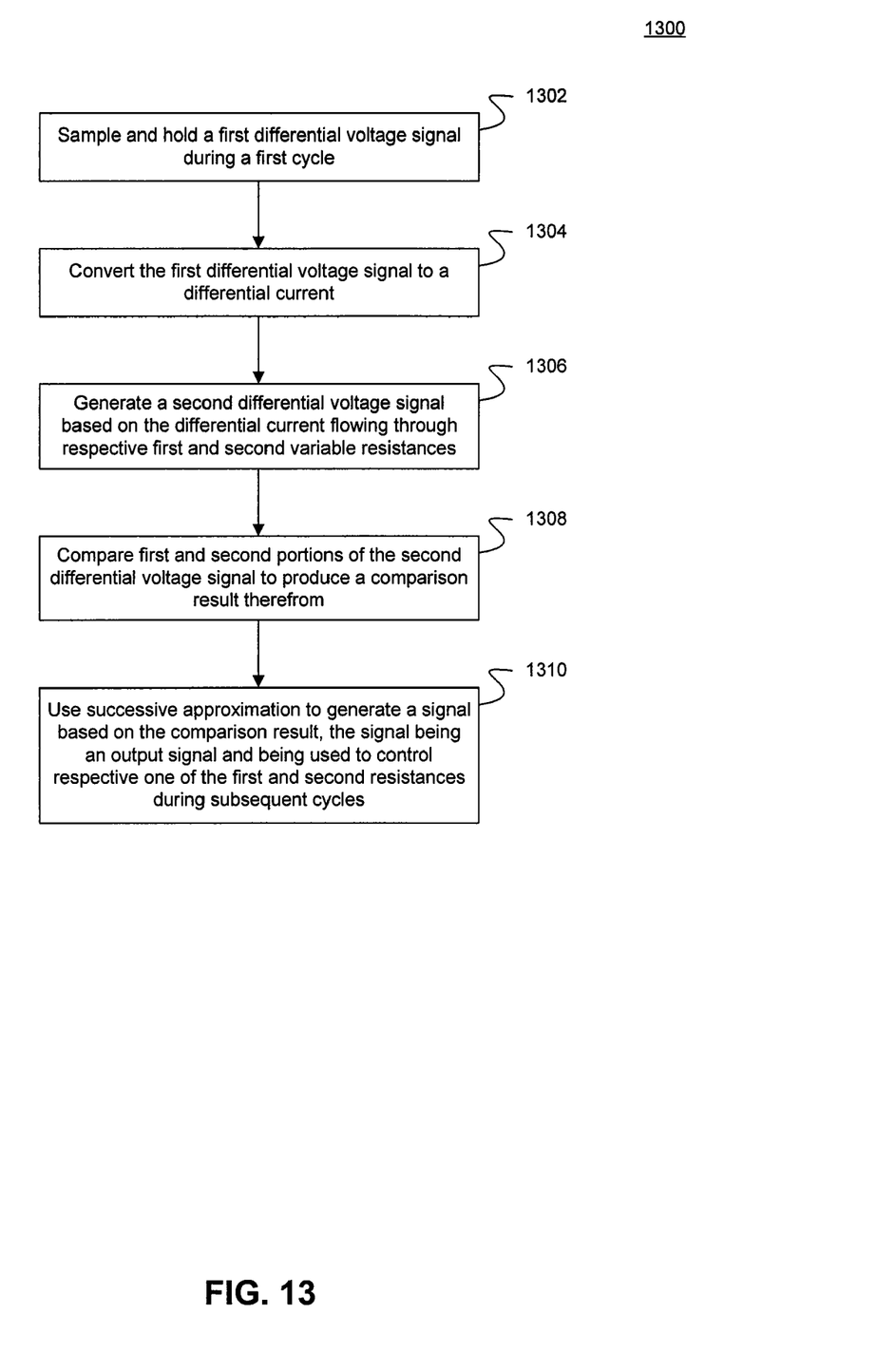
FIG. 13 is a flowchart depicting an exemplary method.

FIG. 13 is a flowchart depicting an exemplary method 1300. In step 1302, a first differential voltage signal is sampled and held during a first cycle. In step 1304, a first differential voltage signal is converted to a differential current. In step 1306, a second differential voltage signal is generated based on the differential current flowing through respective first and second variable resistances. In step 1308, first and second portions of the second differential voltage signal are compared to produce a comparison result therefrom. In step 1310, successive approximation is used to generate a signal based on the comparison result. The signal produced during step 1310 may be used as both an output signal to form the digital signal and as a control signal to control resistances of respective ones of the first and second variable resistances during subsequent cycles.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A system, comprising:
    a sample and hold device configured to receive an input voltage signal during a first cycle;
    a voltage-to-current converter configured to convert the input voltage signal into a current;
    a resistive digital-to-analog converter (R-DAC) configured to receive the current and to generate a differential voltage signal therefrom;
    a comparator configured to receive the differential voltage signal from the R-DAC and to produce a comparison result therefrom; and
    a successive approximation device (SAR) configured to generate a signal based on the comparison result, the signal being both output from the system and fed-back to the R-DAC to control a resistance of the R-DAC during subsequent cycles.

2. The system of claim 1, wherein the R-DAC comprises:
    a first bank of parallel resistors configured to produce a first resistance value used to produce a first portion of the differential voltage signal; and
    a second bank of parallel resistors configured to produce a second resistance value use to produce a second portion of the differential voltage signal.

3. The system of claim 2, wherein the first and second bank of parallel resistors are configured to be varied based on the signal from the SAR.

4. The system of claim 1, wherein:
    the input voltage signal is a differential voltage;
    the voltage-to-current converter is configured to produce a differential current as the current; and
    the R-DAC comprises first and second banks having respective variable resistances in each, such that a first portion of the differential current is received by the first bank and a second portion of the differential current is received by the second bank.

5. The system of claim 4, wherein:
the first and second banks are configured to produce first and second respective portions of the differential voltage received by the comparator; and
the comparator is configured to compare the first and second respective portions of the differential voltage from the R-DAC to each other to produce the signal.

6. The system of claim 1, wherein:
the R-DAC comprises first and second banks of resistors;
during the first cycle respective first and second respective resistances of the first and second banks of resistors are substantially equal and the first and second portions of the differential voltage produced by the R-DAC are different; and
during a last one of the cycles the first and second resistances of the first and second banks of resistors are adjusted by the signal from the SAR, such that the first and second portions of the differential voltage produced by the R-DAC are substantially equal.

7. The system of claim 1, wherein the SAR is configured to produce an 8-bit digital signal as the signal after 8 cycles.

8. The system of claim 1, wherein the signal output from the SAR is a digital signal that is received by a register.

9. A method, comprising:
sampling and holding a first differential voltage during a first cycle;
converting the first differential voltage to a differential current;
generating a second differential voltage from the differential current flowing through parallel-coupled respective first and second variable resistances of a resistive digital-to-analog converter (R-DAC);
comparing first and second portions of the second differential voltage to produce a comparison result therefrom; and
using successive approximation to generate a signal based on the comparison result, the signal being an output signal and being used to control resistances of respective ones of the first and second variable resistances during subsequent cycles.

10. The method of claim 9, wherein the generating comprises:
using a first set of parallel coupled resistors to produce the first variable resistance; and
using a second set of parallel coupled resistors to produce the second variable resistance.

11. The method of claim 9, wherein:
during the first cycle the first and second resistances are substantially equal and first and second portions of the second differential voltage are different; and
during a last one of the cycles the first and second resistances are adjusted by the signal so that the first and second portions of the second differential voltage are substantially equal.

12. The method of claim 9, wherein the using comprises producing an 8-bit signal as the output signal after 8 of the cycles.

13. The method of claim 9, wherein the using comprises transmitting the output signal to a register.

14. A circuit, comprising:
a sample and hold portion;
a SAR;
a R-DAC coupled to the SAR;
a converter coupled between the sample and hold portion and the R-DAC; and
a comparator coupled between the R-DAC and the SAR,
wherein the R-DAC is configured to receive a first input signal from the converter and a second input signal from the SAR.

15. The circuit of claim 14, wherein the R-DAC comprises:
a first resistance coupled to the SAR, a first node of a differential output of the converter, and a first node of a differential input of the comparator; and
a second resistance, coupled parallel to the first resistance, and coupled to the SAR at a second node of the differential output of the converter, and at a second node of the differential input of the comparator.

16. The circuit of claim 15, wherein the first and second resistances are configured as variable resistances.

17. The circuit of claim 15, wherein the first and second resistances comprises banks of parallel-coupled switched-controlled resistors.

18. The circuit of claim 14, wherein the converter comprises a voltage-to-current converter.

* * * * *